United States Patent [19]
Grote et al.

[11] Patent Number: 5,126,696
[45] Date of Patent: Jun. 30, 1992

[54] W-BAND WAVEGUIDE VARIABLE CONTROLLED OSCILLATOR

[75] Inventors: Albert J. Grote, Carson City, Nev.; Paul J. Johnson, Gardena; James R. Hayes, Torrance, both of Calif.

[73] Assignee: TRW Inc., Redondo Beach, Calif.

[21] Appl. No.: 744,051

[22] Filed: Aug. 12, 1991

[51] Int. Cl.⁵ .......................... H03B 7/14; H03B 9/14
[52] U.S. Cl. .............................. 331/96; 331/107 DP; 331/107 G; 331/177 V
[58] Field of Search .............. 331/96, 107 DP, 107 G, 331/117 D, 177 V

[56] References Cited
U.S. PATENT DOCUMENTS 3,882,419  5/1975  Swartz et al. .............. 331/107 DP
4,999,587  3/1991  Evans ........................ 331/177 V Primary Examiner—Siegfried H. Grimm
Attorney, Agent, or Firm—G. Gregory Schivley; Ronald L. Taylor

[57] ABSTRACT

A W-band waveguide variable controlled oscillator incorporating a capacitively coupled Gunn diode and varactor diode arranged in such a manner that adverse environmental conditions do not deleteriously effect the stability of the output of the oscillator. The Gunn diode is electrically connected to a waveguide chamber within the oscillator and includes a resonator electrically connected to its end cap. The resonator is electrically connected to a DC bias source by means of a DC bias filter and a wire inductor. Opposite and above the Gunn diode is a varactor assembly including a varactor diode, which is also electrically connected to a DC bias source through a DC bias filter. A variable coupling spacer within the varactor assembly adjusts the distance between the varactor diode and the Gunn diode such that the capacitive coupling between the two can be adjusted. In addition, an adjustable back-short is incorporated within the waveguide channel to adjust the power output of the oscillator. Also, a fine tuning screw is threadably engaged to the waveguide channel to adjust the capacitance of the resonator. This configuration enables the oscillator to have a stable output and low power losses under adverse environmental conditions.

21 Claims, 2 Drawing Sheets

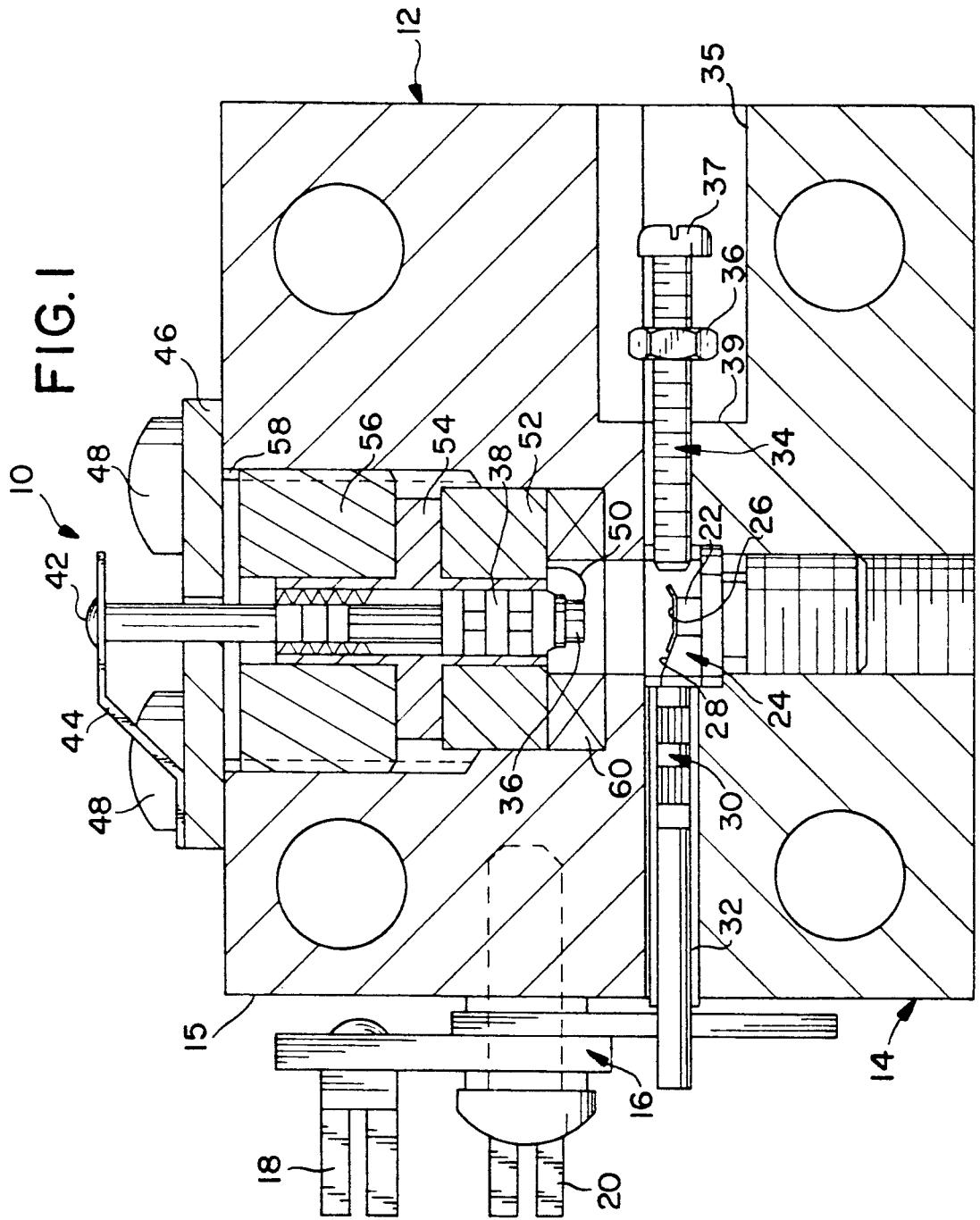

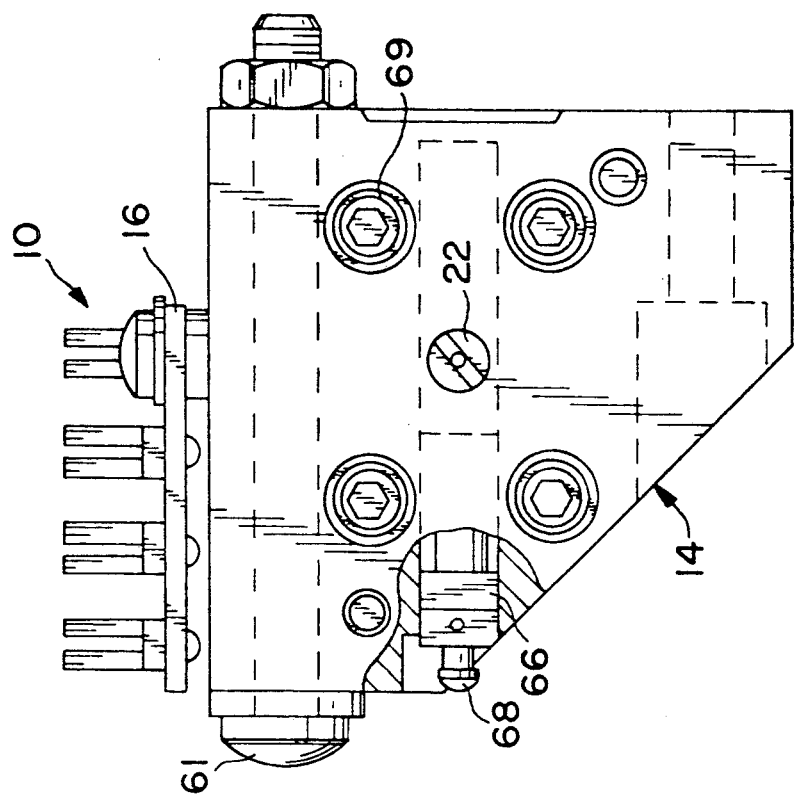
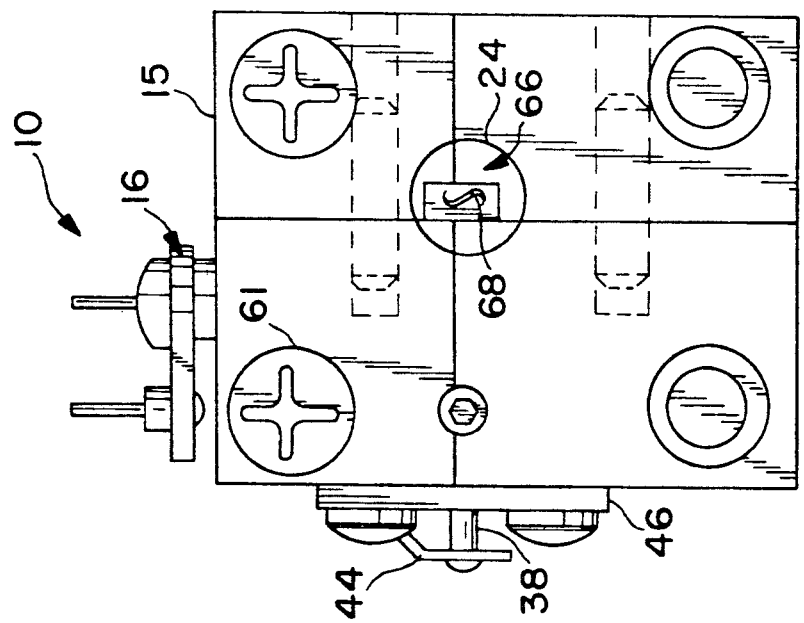

W-BAND WAVEGUIDE VARIABLE CONTROLLED OSCILLATOR

BACKGROUND OF THE INVENTION

1. Field of the Invention

This invention relates generally to a variably controlled microwave source, and more particularly, to a W-band variably controlled microwave source incorporating solid state diode oscillators exhibiting a stable frequency output.

2. Background of the Related Art

There are many applications known which require an RF source for the generation of a microwave output signal. Typical applications include tunable local oscillators, phase lock sources, transmitter drivers and signal generators. Many of these applications require a highly stable and compact microwave source which has low power losses. It has been known in the art heretofore to incorporate semiconductor oscillators as a compact source to generate the microwaves. Generally, these semiconductor oscillators will include at least one negative-resistance semiconductor. One popular negative-resistance semiconductor oscillator is the well known Gunn diode. A Gunn diode is a transfer electron-type device which achieves negative-resistance due to a transfer of electrons from high to low mobility in the energy bands of the semiconductor material. Other diodes, including avalanche diodes, tunnel diodes, etc., are also well known semiconductor oscillators.

In operation, a semiconductor oscillator will generate a microwave signal depending on the bias voltage which is applied to it. The semiconductor oscillator will generally resonate inside a waveguide chamber which amplifies the microwave frequency and directs it. Altering the chamber parameters effects the resonating frequency of the semiconductor source. In order to achieve fine-tuning of the output microwave, it is known in the art to utilize a varactor diode. A varactor diode is a passive P/N junction diode which has a variable capacitance as different bias voltages are applied to it. Consequently, if a bias voltage applied to a varactor diode is changed, the varactor diode will exhibit a change in its capacitance. Therefore, by capacitively coupling a varactor diode to a Gunn diode in the same waveguide chamber and altering the bias voltage applied to the varactor diode, the output of the microwave device can be tuned to a range of frequencies around the main frequency of the Gunn diode.

Many different variations and designs of the above described RF source are known in the art. However, these known devices generally do not achieve the most desirable frequency stability and low power losses required for the output frequency of a compact semiconductor source. Adverse environmental conditions causing vibration and temperature variations within the different components may effect the parameters of the microwave source causing undesirable shifts in the frequency output of the RF source. Clearly then, the less impact changes in the environment have on the different parameters of the microwave source, the greater the stability of the output signal.

What is needed then is a semiconductor microwave source which is reliable, dependable, compact and which does not suffer the drawbacks of the prior art as to adverse environmental conditions. It is therefore an object of the present invention to provide such an oscillator.

SUMMARY OF THE INVENTION

This invention is directed to a variable controlled oscillator operating at W-band microwave frequency having very high stability and low power losses. In one preferred embodiment, a Gunn diode is electrically connected to the floor of a waveguide channel. A resonator is electrically connected to the cap of the Gunn diode and is, in turn, electrically connected to a low pass filter network by a wire inductor. A forward bias voltage from a bias source is applied to the low pass filter which causes the Gunn diode to oscillate at a frequency determined by Gunn diode and resonator parameters. The frequency signal is directed by the waveguide channel. The low pass filter prevents the RF signal generated by the Gunn diode from propagating back towards the bias source.

Opposite the Gunn diode in the waveguide chamber is a capacitively coupled varactor diode. The varactor diode is electrically connected to a low pass filter and is back biased by a second bias source applied to the low pass filter. A variable spacer portion positions the varactor diode in a varactor capacity and is adjustable to adjust the distance between the varactor diode and the Gunn diode to change the capacitive coupling between the two diodes. The varactor diode includes a fine wire inductor electrically connected to the top of the diode and grounded to the metal block forming the waveguide channel. A waveguide back-short is variably positionable within the waveguide channel to adjust the power output of the oscillator and set the reactance of the resonator. In addition, a fine tuning screw is incorporated adjacent the resonator to adjust the capacitance of the resonator in order to fine tune the resonating frequency. The combination of these variable parameters in a configuration of this type enables the oscillator to be very stable over a range of adverse environmental conditions.

Additional objects, advantages, and features of the present invention will become apparent from the following description and appended claims, taken in conjunction with the accompanying drawings.

BRIEF DESCRIPTION OF THE DRAWINGS

FIG. 1 is a sectional view of a waveguide variable controlled oscillator according to a preferred embodiment of the present invention;

FIG. 2 is a rear view of the variable controlled oscillator of FIG. 1; and

FIG. 3 is a bottom view of the variable controlled oscillator of FIG. 1.

DETAILED DESCRIPTION OF THE DRAWINGS

The following description of the preferred embodiment is merely exemplary in nature and is in no way intended to limit the invention or its applications or uses.

Turning to FIG. 1, a basic understanding of the structural relationship of the different components of a variable controlled oscillator (VCO) 10, according to a preferred embodiment of the present invention, is shown in a sectional view. Oscillator 10 comprises two metal half-block sections 12 and 14 configured in a split block design which defines a waveguide channel 24, and accommodates the positioning of the components of oscillator 10 in a desirable configuration. The opening of waveguide channel 24 would be at a surface of oscillator 10 which is parallel to the sectional surface as shown (see FIG. 3). Rigidly connected to an outside surface 15 of half-block section 12 is a terminal board 16. Terminal board 16 is generally threadably engaged within block 12 at surface 15, and includes a series of terminal connections, shown here as connections 18 and 20, for directing electrical signals to and from the appropriate components of oscillator 10. The positioning, structural configuration and arrangement of terminal board 16 is not critical to the invention.

Positioned within waveguide channel 24 is a negative-resistance semiconductor, typically a Gunn diode 22. Gunn diode 22 provides the main operating frequency of oscillator 10 as will be described hereunder. Gunn diode 22 is generally rigidly positioned by means of threading into half block 14 through the floor of waveguide channel 24 as shown, and thus is electrically connected in a grounded relationship. Gunn diode 22 includes a rectangular shaped resonator 26 electrically soldered to the diode cap of Gunn diode 22 within waveguide channel 24. The dimensions and positioning of resonator 26 determines the oscillation frequency and power of VCO 10, and establishes an impedance relationship between waveguide channel 24 and Gunn diode 22. Gunn diode 22 is electrically connected by means of resonator 26 and a wire inductor 28 to a DC low pass filter 30. Low pass filter 30 is generally a series of coaxial dumbbell sections and an adjoining rod protruding from half-block section 14 for filtering RF energy from resonator 26, as will be described below. A dielectric insulator 32 electrically insulates filter 30 from half-block section 14. Low pass filter 30 is electrically connected (wire not shown) to an appropriate terminal (such as 18 or 20) to supply a DC bias voltage to Gunn diode 22.

Across waveguide channel 24 from filter 30 is a tuning screw 34. Tuning screw 34 is threadably engagable in half-block section 14 to variably adjust the capacitance of resonator 26, and thus fine tune the output frequency of resonator 26. As is apparent, an end of tuning screw 34 is disposed within waveguide channel 24 adjacent resonator 26. Tuning screw 34 is accessible through an orifice 35 within half-blocks 12 and 14 so that the position of tuning screw 34 within waveguide channel 24 can be changed by rotating head 37 of screw 34. A locking nut 36 rigidly locks tuning screw 34 in a desirable location by being threadably positionable on screw 34 against a surface 39 within orifice 35.

Also accessible to waveguide channel 24 is a varactor diode 36, generally mounted directly above Gunn diode 22, for providing capacitive tuning to the output frequency of Gunn diode 22. Varactor diode 36 is generally a GaAs semiconductor and is part of a varactor assembly positioned within a cavity 58. The varactor assembly includes varactor diode 36, a low pass DC bias filter 38, a wire inductor 50, a spacer 52, an anodized insulation sleeve 54, a varactor assembly locking nut 56 and a coupling spacer 60 arranged in a desirable manner as will be described hereunder. Varactor diode 36 is electrically connected at a bottom surface to DC bias filter 38 by means of a solder connection. Bias filter 38 is generally configured in a coaxial dumbbell type configuration and is electrically soldered at connection 42 to a spring board contact 44. Opposite to connection 42 spring board contact 44 is rigidly fixed to an insulated washer 46 such that spring board contact 44 provides a mechanical flexing to filter 38 over temperature variations so as to maintain varactor diode 36 in a fixed location. Bias from DC source at terminal board is connected through a wire (not shown) to spring board contact at washer 46. Insulated washer 46 is connected to half-block 12 by means of screws 48 (at four places) and acts as a cover to the varactor assembly within cavity 58.

The opposite end of varactor diode 36 from filter 38 is electrically connected by means of wire inductor 50 to metal spacer 52. Spacer 52 is held in place by varactor assembly locking nut 56. Varactor assembly locking nut 56 is positioned against anodized sleeve 54 which insulates filter 38 from spacer 52 and the remaining conductive portion of half-block section 12. Typically, anodized sleeve 54 is adhered to spacer 52 by means of an appropriate adhesive. An adjustable coupling spacer 60 encircles varactor diode 36 and acts as a device to vary the coupling between varactor diode 36 and Gunn diode 22. The coupling relationship between varactor diode 36 and resonator 26 provided by coupling spacer 60 controls the power output and band width trade-off between the varactor diode 36 and the Gunn diode 22.

FIG. 2 shows a rear view of variable controlled oscillator 10. Spring board contact 44 and filter 38 are on the left side and terminal contact board 16 is at the top. In this view, the half-block sections 12 and 14 are shown in their combined configuration aligned in position by the pins shown in phantom and held together with four (4) bolts 69 (see FIG. 3). Also shown are four mounting bolts 61 for mounting oscillator 10 in a desirable location.

An adjustable self locking back-short 66 is shown from an end view along waveguide channel 24. Back-short 66 is of approximately the same dimension as waveguide channel 24 such that it completely blocks waveguide channel 24 at one end to force the generated microwaves to be reflected out of the other end. Back-short 66 adjusts the power output of VCO 10, and functions as a tuning element to provide a variable reactance at the resonator 26 and the varactor diode 36 interface. Back-short 66, resonator 26 and varactor diode 36 coupling combine to make up a matching network that determines the impedance relationship between the waveguide 24 output port and the Gunn diode 22.

Now turning to FIG. 3, a bottom view of variable controlled oscillator 10 is shown. In this view, part of block 14 is shown in a partial cutaway view to partially expose back-short 66. Back-short 66 adjusts the length of waveguide channel 24 and self locks with screw 68. By releasing locking screw 68, back-short 66 is movable within waveguide channel 24 to either lengthen or shorten waveguide channel 24. Also shown is a bottom connection of Gunn diode 22. As is apparent, the end of back-short 66 is relatively close to Gunn diode 22 compared to the distance between Gunn diode 22 and the output port of waveguide 24. At a top portion of FIG. 3 is terminal block 16. In this view, there are four terminal connections to terminal block 16. Therefore, this design includes two rows of four terminals each.

The configuration of the different active components of variable controlled oscillator lo as discussed above provides a very compact, stable microwave source which operates at approximately 30 to 45 milliwatts in the W-band (75-110 GHz) of the microwave frequencies. To get the main operating frequency of VCO 10, a DC bias voltage is applied to resonator 26 of Gunn diode 22 through filter 30 and wire inductor 28 from a DC bias source terminal board 16 in a forward bias arrangement. Resonator 26 tunes the frequency of Gunn diode 22 depending upon its length and width along with the bias voltage applied to the Gunn diode 22. Inductor 28 acts as a choking device to isolate the bias voltage from the frequency signal generated at the resonator 26. In addition, filter 30 provides an RF short to the microwave signal generated by the Gunn diode 22 and isolates the DC bias source from the waveguide. Resonator 26 resonates at a frequency determined by its length, width and the DC bias of Gunn diode 22. Backshort 66 provides adjustment to waveguide channel 24 optimizing the power output and frequency. The capacitance of resonator 26 can be changed by rotating tuning screw 34, which therefore acts as a fine tuning to change the oscillation frequency.

Coupled to resonator 26 of Gunn diode 22 is the capacitance of varactor diode 36. Varactor diode 36 has a capacitance dependant upon the bias voltage applied to it through filter 38. In this configuration, varactor diode 36 is back biased creating a variable capacitance depending on the bias voltage applied to it. The capacitance of varactor diode 36 is coupled to the output of Gunn diode 22 by means of a coupling spacer 60. By adjusting coupling spacer 60, varactor diode 36 will either be lowered or raised within cavity 58, thus changing the distance between varactor diode 36 and Gunn diode 22. Therefore, by adjusting the bias voltages applied to both the Gunn diode 22 and varactor diode 36, adjusting the back-short 66, and/or adjusting the coupling distance between varactor diode 36 and Gunn diode 22, it is possible to accurately, stably and reliably tune VCO 10 to a specific output frequency and power without adverse effects from environmental conditions which may have an effect on the above parameters.

The foregoing discussion discloses and describes merely exemplary embodiments of the present invention. One skilled in the art will readily recognize from such discussion and from the accompanying drawings and claims, that various changes, modifications and variations can be made therein without departing from the spirit and scope of the invention as defined in the following claims.

What is claimed is:

1. A variable controlled oscillator comprising:
   a metal block defining a waveguide channel;
   a semiconductor oscillator electrically connected to a floor of the waveguide channel, said semiconductor oscillator including a resonator electrically connected to a cap of the semiconductor oscillator opposite the waveguide floor;
   first bias means for applying an electrical DC bias to said resonator such that said semiconductor oscillator oscillates at a specific frequency;
   a varactor diode positioned substantially opposite to said semiconductor oscillator within a varactor assembly cavity;
   second bias means for applying an electrical DC bias to said varactor diode; and
   a variable coupling spacer positioned within the varactor assembly cavity wherein said coupling spacer is adjustable to alter the distance between the varactor diode and the semiconductor oscillator.

2. The variable controlled oscillator according to claim 1 wherein said first bias means includes a first DC voltage source, a first DC bias filter, and a first wire inductor arranged such that said first DC source is electrically connected to said first DC bias filter at one end and said first wire inductor is electrically connected to said first DC bias filter at an opposite end and said resonator is electrically connected to said first wire inductor opposite said first DC bias filter to prevent RF signals generated by said semiconductor oscillator from propagating back to the first DC source.

3. The variable controlled oscillator according to claim 1 wherein said second bias means includes a second DC voltage source, a second DC bias filter, and a second wire inductor, said second DC bias filter filtering the DC bias voltage applied to said varactor diode to prevent RF signals generated by said varactor diode from propagating back to the second DC source.

4. The variable controlled oscillator according to claim 1 further comprising an adjustable self locking back-short, said adjustable self locking back-short being variably positionable within said waveguide channel such that a microwave signal generated by the semiconductor oscillator is reflected off of said back-short and directed out of said waveguide channel opposite to said back-short.

5. The variable controlled oscillator according to claim 1 further comprising a fine tuning screw, said fine tuning screw threadably engagable within said block and having an end positioned within said waveguide channel adjacent to said resonator such that rotation of said screw adjusts the position of said screw within said waveguide channel.

6. The variable controlled oscillator according to claim 2 wherein said first DC bias filter is coaxial.

7. The variable controlled oscillator according to claim 2 wherein the first DC voltage source supplies a forward DC bias to the semiconductor oscillator.

8. The variable controlled oscillator according to claim 3 wherein the second DC voltage source supplies a DC back bias voltage to said varactor diode.

9. The variable controlled oscillator according to claim 1 wherein the semiconductor oscillator is a Gunn diode.

10. The variable controlled oscillator according to claim further comprising an anodized sleeve and spacer disposed within the varactor assembly cavity, said anodized sleeve insulating the second bias means from the metal block and spacer.

11. The variable controlled oscillator according to claim 1 wherein said resonator is rectangular shaped.

12. The variable controlled oscillator according to claim further comprising a spring board contact, said spring board contact being connected to an end of the second DC bias filter opposite to the varactor diode and to the metal block for providing a mechanical resistance to the varactor diode against expansion and contraction.

13. A variable controlled oscillator comprising:
   a plurality of metal block sections defining a waveguide channel;
   a semiconductor oscillator electrically connected to a floor of the waveguide channel, said semiconductor oscillator including a resonator electrically connected to an end cap of aid semiconductor oscillator opposite said floor; and
   a varactor assembly positioned within a cavity defined by the metal block sections wherein said waveguide channel and said cavity are interconnected, said varactor assembly including a varactor diode positioned relative to said semiconductor oscillator and an adjustable spacer portion for adjusting the distance between the varactor diode and the semiconductor oscillator.

14. The variable controlled oscillator according to claim 3 wherein said varactor assembly further includes a first DC bias filter and a first wire inductor, said first DC bias filter receiving a DC bias voltage to apply the DC bias voltage to said varactor diode at one end through said first DC bias filter in a back bias configuration and said wire inductor being electrically connected to an opposite end of said varactor diode and at least one metal block section.

15. The variable controlled oscillator according to claim 13 further comprising a second DC bias filter and a second wire inductor, said second DC bias filter being electrically connected to one end of said second wire inductor and the opposite end of said second wire inductor being electrically connected to the resonator of the semiconductor oscillator such that a DC voltage bias is applied to said semiconductor oscillator through said second DC bias filter such that said second DC bias filter filters out RF signals generated by said resonator.

16. The variable controlled oscillator according to claim 13 further comprising an adjustable self locking back-short, said adjustable self locking back-short being variably positionable within said waveguide channel to optimize the frequency and power of the oscillator.

17. The variable controlled oscillator according to claim 13 further comprising a fine tuning screw, said fine tuning screw threadably engagable within said block and having an end positioned within said waveguide channel adjacent to said resonator such that rotation of said screw adjusts the position of said screw within said waveguide channel.

18. The variable controlled oscillator according to claim 14 wherein said varactor assembly further includes an insulative portion and an engagement nut, said insulative portion insulating said first DC bias filter from the metal block sections.

19. The variable controlled oscillator according to claim 14 further comprising a spring board contact, said spring board contact being connected to an end of the first DC bias filter opposite to the varactor diode and to the metal block for providing a mechanical resistance to the varactor diode against expansion and contraction.

20. A variable controlled oscillator comprising:
a plurality of metal block sections defining a waveguide channel;
a Gunn diode electrically connected to a floor of the waveguide channel, said Gunn diode including a mechanical resonator electrically connected to a cap of the Gunn diode opposite the waveguide floor;
first bias means for applying an electrical DC bias to said Gunn diode such that said Gunn diode oscillates at a specific frequency, said first bias means including a first DC voltage source, a first DC bias filter, and a first wire inductor arranged such that a first end of said wire inductor is connected to said resonator, a second opposite end of said wire inductor being connected to a first end of said DC bias filter, a second opposite end of said DC bias filter being connected to said first DC voltage source such that RF signals generated by said Gunn diode do not propagate back to the first DC source;
a varactor assembly positioned within a cavity defined by the metal block sections wherein said waveguide channel and said cavity are interconnected, said varactor assembly including a varactor diode positioned relative to said Gunn diode and an adjustable spacer portion for adjusting the distance between the varactor diode and the Gunn diode, said varactor assembly further including a second bias means for applying an electrical DC bias to said varactor diode, said second bias means including a second DC voltage source, a second DC bias filter, and a second wire inductor, wherein said second DC bias filter receives a DC bias voltage from said second DC bias source to apply the DC bias voltage to one end of said varactor diode at one end through said second DC bias filter in a back bias configuration and said second wire inductor being electrically connected to an opposite end of said varactor diode and at least one metal block section;
an adjustable self-locking back-short, said adjustable self-locking back-short being variably positionable within said waveguide channels to optimize the frequency and power of the oscillator; and
a fine tuning screw, said fine tuning screw threadably engagable within said block and having an end positioned within said waveguide channel adjacent to said resonator such that rotation of said screw adjusts the position of said screw within said waveguide channel.

21. The variable controlled oscillator according to claim 20 further comprising a spring board contact, said spring board contact being connected to an end of the second DC bias filter opposite to the varactor diode and to the metal block for providing a mechanical resistance to the varactor diode against expansion and contraction.

* * * * *